United States Patent [19]

Damon et al.

[11] 3,798,507

[45] Mar. 19, 1974

[54] RACK ASSEMBLY FOR ELECTRICAL TERMINAL PANELS

[75] Inventors: Neil F. Damon, Cumberland; Herbert G. Yeo, Lincoln, both of R.I.

[73] Assignee: Augat, Inc., Attleboro, Mass.

[22] Filed: Nov. 2, 1972

[21] Appl. No.: 303,100

[52] U.S. Cl. .............................. 317/101 DH, 211/41

[51] Int. Cl. ............................................... H02b 1/62

[58] Field of Search ................. 317/101 DH; 211/41

[56] References Cited

UNITED STATES PATENTS

| | | | |
|---|---|---|---|
| 3,699,396 | 10/1972 | Colaud et al. | 317/101 DH |
| 3,511,385 | 5/1970 | Ayling | 317/101 H |

*Primary Examiner*—David Smith, Jr.

[57] ABSTRACT

A mounting apparatus of simplified construction suitable for the removable attachment and electrical interconnection of a multiplicity of logic panels which include appropriate electrical circuitry and connection means.

5 Claims, 3 Drawing Figures

RACK ASSEMBLY FOR ELECTRICAL TERMINAL PANELS

FIELD OF THE INVENTION

This invention relates generally to circuit mounting and connecting devices and more particularly concerns a rack assembly for mounting a multiplicity of logic panels thereto.

DISCUSSION OF THE PRIOR ART

In modern electronic apparatus such as computers it is often necessary to mount and interconnect a large number of electronic elements, circuits, and integrated circuit packages with relatively high density. One major consideration in such mounting and connecting systems is ease in connecting and disconnecting a given group of circuits from the apparatus. Clearly another major consideration is size and compactness of the mounting assembly. Particularly in using miniaturized circuitry such as integrated circuits which have a relatively uniform low profile, it is desirable to place individual circuit boards, to which are mounted many such miniaturized elements, as closely as possible to each other.

Automated mass production techniques dictate that a standard mounting system be used insofar as possible in a given apparatus. For example, in a computer, the memory will be constructed out of a plurality of modular structures, each containing a multiplicity of logic panels having a large number of individual electronic components or integrated circuits mounted thereon. Commonly such logic panels include preprinted electrical connection means which are adapted to mate with edge connectors that are fixed to a back panel mounted to a rack which is further adapted to hold the logic panels removably in place. Both the panels and the connectors likely have a multiplicity of wire wrapping pins or other types of terminal means extending therefrom for electrical interconnection. In conventional logic panel racks, each edge connector normally has one or more of the electrical terminals soldered to the appropriate foil on the back panel which forms the base of the panel rack. Each edge connector is then further securely attached to the circuit board by means of a nut, bolt, plain washer and lock washer at each end of the connector. It may thus be appreciated that assembly of such structure requires tedious and time-consuming manual labor in contrast to the majority of the manufacture of the logic panel rack which can be highly automated. The result of the present method is manufacturing inefficiency resulting in high cost of the product, coupled with a greater chance of human error occurring during assembly.

SUMMARY OF THE INVENTION

According to the present invention, a logic panel rack assembly of improved construction is provided. For proper electrical connection, appropriate terminals of the edge connectors may be soldered to the base circuit board or back panel if necessary. The ends of the edge connectors are mechanically secured to the base circuit board by means of elongated clamping members which are bolted to the circuit board. Each longitudinal clamping member secures one end of each connector in fixed spatial relation to the corresponding edge of the circuit board. The rack assembly structure encloses the clamping means and the base circuit board having the edge connectors mounted thereto in a manner to facilitate removable coupling of a logic panel to each edge connector within the assembly.

BRIEF DESCRIPTION OF THE DRAWING

The invention will be more fully understood from the following description taken in conjunction with the accompanying drawing in which.

DESCRIPTION OF THE PREFERRED EMBODIMENTS

Figure 1:
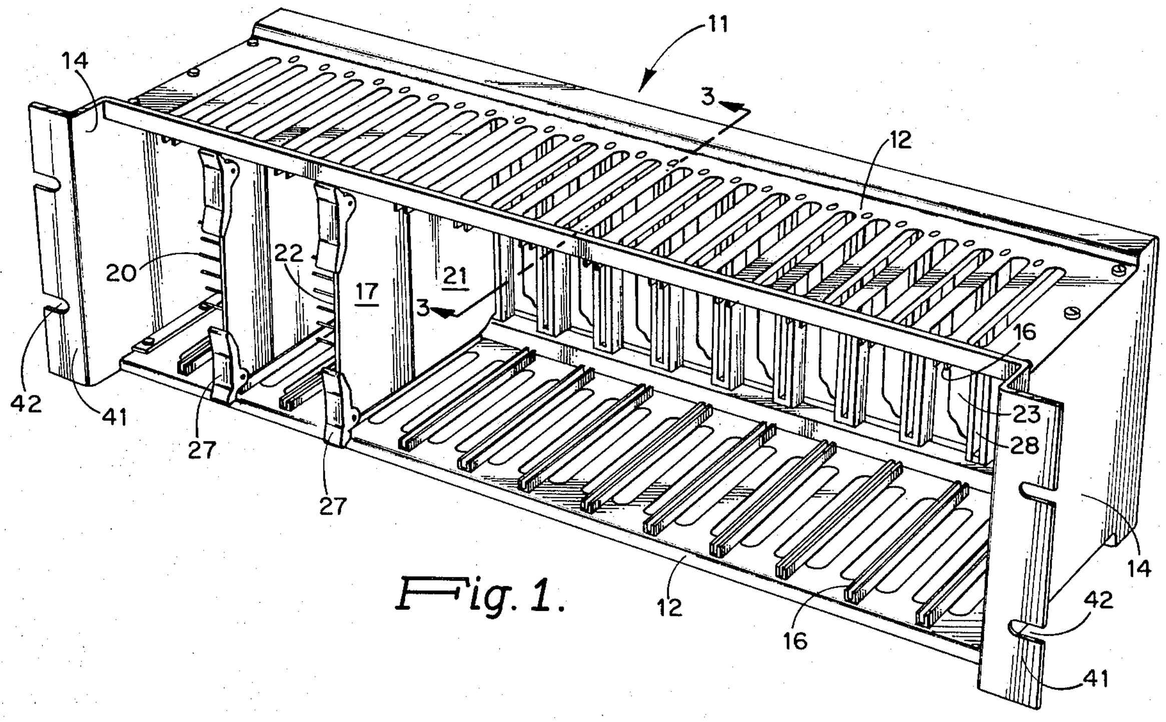
FIG. 1 is a pictorial view of the terminal panel rack assembly constructed according to this invention.

With reference now to the drawing, there is shown a panel rack assembly 11 comprising two identical side members 12 secured together by means of two identical end members 14 forming a housing having two open sides. Each side member is provided with a plurality of slotted guides 16 extending across the width of the side members 12 at spaced intervals. These guides may be made of any suitable material such as plastic. A guide in facing relationship on each side member 12 provides cooperative slots to receive opposite edges of a logic panel 17 therebetween. Panels 17 are conventional items having one side 21 adapted to receive the leads of electrical components and integrated circuits as indicated by reference numeral 19, and having electrical terminal means such as wire wrapping pins 2 projecting from opposite side 22 for interconnection of various of the elements 19 mounted to side 21 of the panel. This panel is also formed with a typical printed circuit connector edge 18 adapted to fit into an edge connector of a back panel.

Mounted to the bottom of the rack assembly is base circuit board or back panel 23 which may have an electrical ground foil on one side and a voltage plane foil on the other side in the normal manner. A plurality of edge connectors 24 having wire wrapping pins or other type terminals 25 extending from one side thereof are each adapted to receive the connector edge 18 of panel 17 in slot 28 in the side opposite the electrical connectors. Wire wrapping pins 25 have integral contacts extending within edge connector 24 to make electrical connection with the individual contact paths 26 on panel 17 in the normal manner. Panel 17 is also provided with a pair of lever devices 27 pivotally connected at each of the top corners of the panel. By lifting upon ends 31 of the levers, bearing surfaces 32 contact top edges 33 of side members 12 to forcibly lift panel 17 from its firm contact within slot 28 in connector 24. The panel may be easily removed from the rack by sliding upward in guides 16 after the panel is released from the connector.

Figure 3:
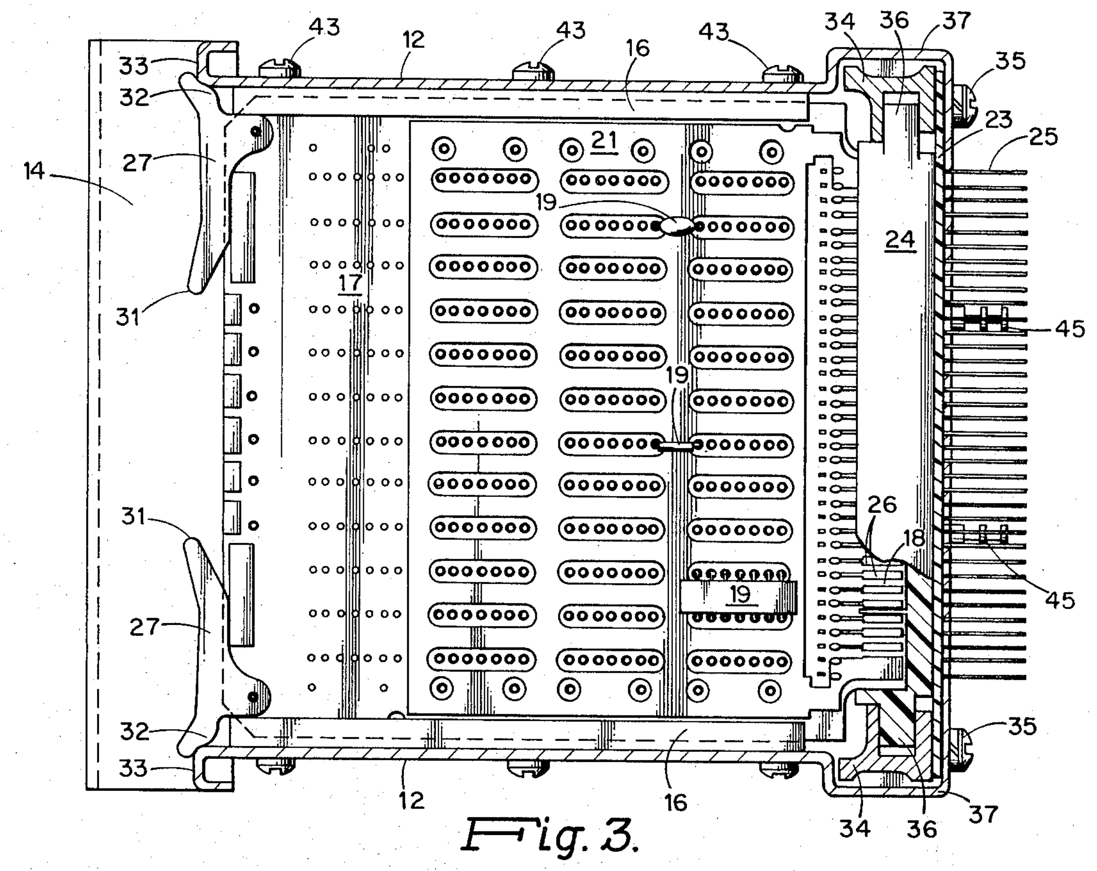
FIG. 3 is a sectional view of the panel rack assembly taken through cutting plane 3—3 of FIG. 1.
Figure 2:
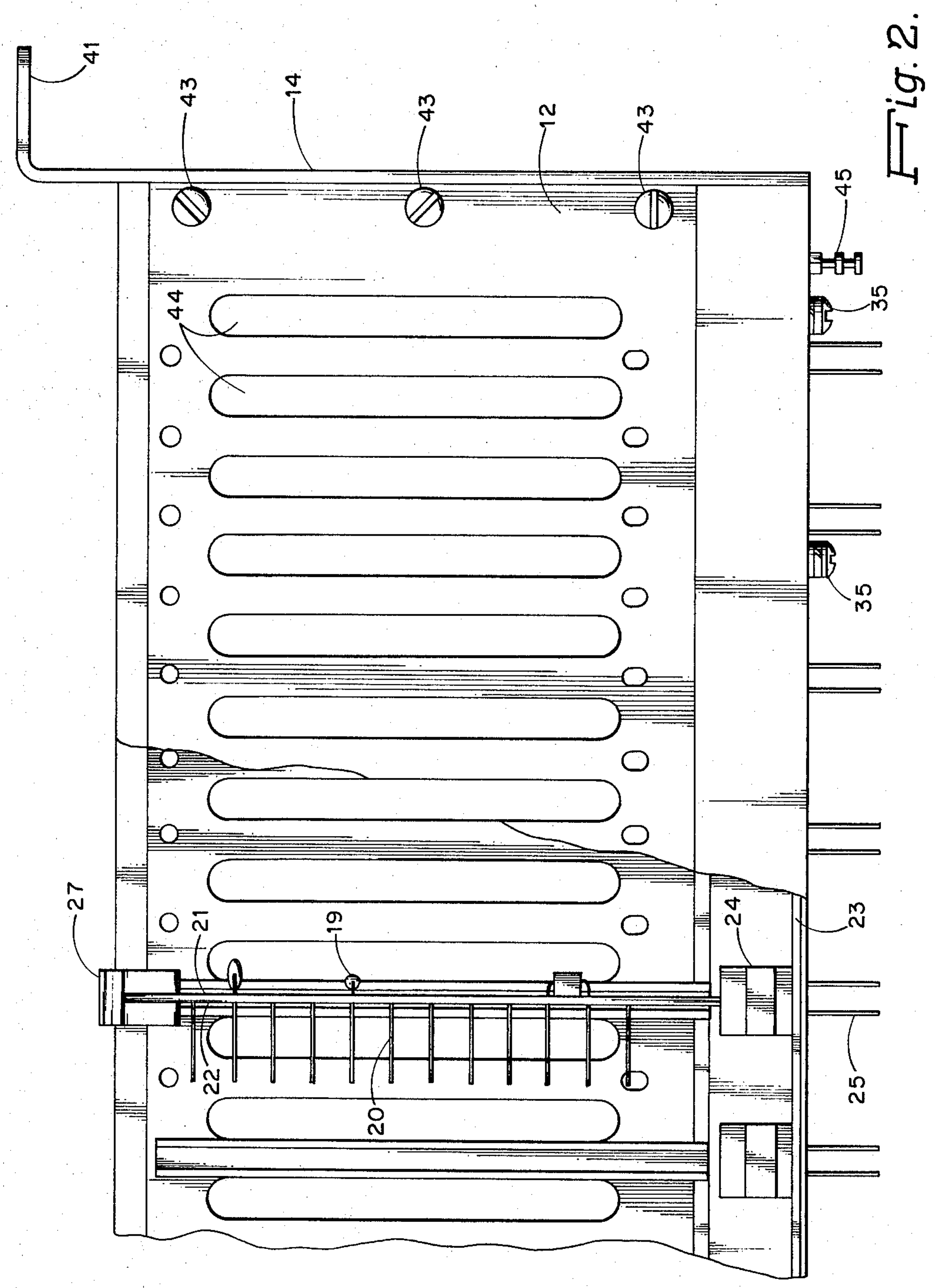
FIG. 2 is a partial cut away side view of the panel rack assembly of FIG. 1 showing a single panel mounted therein.

Elongated clamping members 34 are coextensive in length with circuit board 23 and are secured thereto by appropriate means such as bolts 35. Clamping members 34 have a substantially F-shaped cross section and are adapted to secure connectors 24 to circuit board 23 without the need of using nut, bolt and washer combinations at each end tab 36 of each connector. End tabs 36 of the edge connectors are held in place between the two parallel flanges of the clamping members while one flange thereof is secured to the circuit board by bolt 35. Side panels 12 are formed with channels 37 to receive clamping members 34 and the longitudinal edges of circuit board 23 to which the clamping members are attached. The channels are of such size as to receive the clamping member together with the thickness of circuit board 23 as shown in FIG. 3. Although a gap is shown between the stem of the clamping member and the top of the channel, the depth of the channel will normally be substantially filled by the clamping member and board edge.

The simplified assembly of this structure may now be appreciated. Circuit board 23 is drilled to receive wire wrapping pins 25 of edge connectors 24. When the edge connectors have been mounted to the circuit board in spaced relation as shown in FIG. 1, appropriate ones of the wire wrapping pins may be soldered to the foils of the circuit board for electrical connection thereto. Even if such soldering is accomplished, it does not provide sufficient mechanical strength to ensure that the edge connectors remain in position when a logic panel 17 is removed therefrom. By holding each end of edge connectors 24 firmly in place by means of clamping member 34 which is secured to circuit board 23, it may be appreciated that there is no possibility of the precise locations of edge connectors 24 being disturbed when panels 17 are mounted to or removed from the rack assembly. Clamping members 34 are firmly seated within channels 37 of side members 12 and may also be secured thereto by means of bolts 35 for which appropriate openings in the bottom of channels 37 may be provided if desired.

End members 14 are provided with flanges 41 having slots 42 therein for mounting the assembly within the equipment of which it is a part. Screws 43 are provided to secure the side and end members of the assembly together. The side members are formed with slots 44 to permit air circulation between the panels mounted in the assembly. These housing members may be made of aluminum or any other suitable light weight durable material. The clamping members 34 may be made of extruded aluminum in indefinite lengths which are then cut as desired and drilled and tapped to receive bolts 35. Appropriate external electrical terminals 45 are also provided extending from back panel 23.

From the foregoing it may now be appreciated that this invention greatly simplifies the manufacture of panel rack assemblies. For such a structure adapted to receive thirteen logic panels as a typical example, instead of individually applying the edge connectors by means of 26 sets of nuts, bolts, plain washers and lock washers, it is now only necessary to use approximately four sets of nuts, bolts and washers to secure the clamping members and the edge connectors to the circuit board. This subassembly is then easily mounted within the frame provided with side members 12 and end members 14. The relative reduction in manufacturing costs is readily apparent. Furthermore, if it becomes necessary to replace, remove or add edge connectors, it is easily done by simply removing clamping members 34 from board 23 to permit ready access to all of the edge connectors simultaneously.

In view of the above description it is likely that modifications and improvements will occur to those skilled in the art which are within the scope of this invention.

What is claimed is:

1. A rack assembly for electrical terminal panels comprising:
- a pair of side members;
- a pair of end members, said side members and end members being connected together to form a rectangular housing having two open sides;
- a base circuit board;
- a pair of elongated clamping members secured to said base circuit board along the opposite long edges thereof; and
- a plurality of edge connectors placed on said base circuit board and secured thereto by means of said slamping members;
- each of said side members being formed with a channel to receive one long edge of said base circuit board together with said clamping members secured thereto, said base circuit board substantially closing one open side of said housing.

2. A rack assembly for electrical terminal panels comprising:
- a pair of side members;
- a pair of end members, said side members and said end members being connected together to form a rectangular housing having two open sides;
- a base circuit board;
- a plurality of edge connectors placed on said base circuit board; and
- a pair of elongated clamping members secured to said base circuit board along the opposite long edges thereof, said clamping members being formed with a pair of spaced parallel longitudinal flanges extending from one side thereof, a portion of the end of each edge connector being closely confined between said flanges to secure said edge connectors to said circuit board;
- said clamping members being secured to each of said side members adjacent one long edge thereof whereby said base circuit board substantially closes one open side of said housing.

3. The rack assembly recited in claim 2 wherein:
- said edge connectors are each formed with tabs projecting longitudinally from opposite ends; and
- said clamping members are formed with an F-shaped cross section, said edge connector tabs being positioned between the parallel flanges of said clamping members.

4. The rack assembly recited in claim 2 wherein said edge connectors have electrical terminals extending from one side thereof, said pins projecting through mating holes drilled through said base circuit board.

5. A rack assembly for electrical terminal panels comprising:
- a pair of side members having channels adjacent one long edge thereof;
- a pair of end members secured to said side members to form a rectangular housing having two open sides;
- a base circuit board having a multiplicity of holes drilled therethrough;
- a plurality of edge connectors having electrical terminals extending from one side thereof, said pins projecting through said holes in said base circuit board, said edge connectors each being formed with tabs projecting longitudinally from opposite ends; and a pair of elongated F-shaped clamping members secured to opposite edges of said base circuit board and retaining said tabs between the parallel flanges of said clamping members, said clamping members being dimensioned to fit, together with the thickness of said base circuit board, closely within said channels in said side members, the sub-assembly of said base circuit board, edge connectors and clamping substantially closing one open side of said housing.

* * * * *